US012415720B2

(12) United States Patent
Hartwell

(10) Patent No.: US 12,415,720 B2
(45) Date of Patent: Sep. 16, 2025

(54) MEMS ELECTRICAL AND PHYSICAL CONNECTION VIA SOLDER COUPLINGS

(71) Applicant: InvenSense, Inc., San Jose, CA (US)

(72) Inventor: Peter George Hartwell, Menlo Park, CA (US)

(73) Assignee: InvenSense, Inc., San Jose, CA (US)

( * ) Notice: Subject to any disclaimer, the term of this patent is extended or adjusted under 35 U.S.C. 154(b) by 665 days.

(21) Appl. No.: 17/871,310

(22) Filed: Jul. 22, 2022

(65) Prior Publication Data
US 2022/0363534 A1 Nov. 17, 2022

Related U.S. Application Data

(63) Continuation-in-part of application No. 17/689,584, filed on Mar. 8, 2022, now Pat. No. 11,802,041, which is a continuation of application No. 16/717,660, filed on Dec. 17, 2019, now Pat. No. 11,299,393.

(51) Int. Cl.
B81B 7/00 (2006.01)
(52) U.S. Cl.
CPC .................................. B81B 7/007 (2013.01)
(58) Field of Classification Search
CPC ............ B81B 7/007; B81B 2201/0235; B81B 2201/0242; B81C 2203/0735
See application file for complete search history.

(56) References Cited

U.S. PATENT DOCUMENTS

| 9,379,089 | B2 | 6/2016 | Yang et al. |
| 9,726,689 | B1 | 8/2017 | Desai et al. |
| 11,299,393 | B2 | 4/2022 | Hartwell |
| 11,802,041 | B2 * | 10/2023 | Hartwell ................. B81B 7/007 |
| 2011/0006381 | A1 | 1/2011 | Feiertag et al. |
| 2015/0259195 | A1 | 9/2015 | Lo et al. |
| 2015/0284244 | A1 | 10/2015 | Ho et al. |
| 2016/0016789 | A1 | 1/2016 | Yu et al. |
| 2016/0264402 | A1 | 9/2016 | Yu et al. |
| 2016/0297674 | A1 | 10/2016 | Man et al. |
| 2016/0325984 | A1 | 11/2016 | Dueweke et al. |
| 2017/0217767 | A1 | 8/2017 | Gudeman et al. |

(Continued)

FOREIGN PATENT DOCUMENTS

| CN | 103523745 A | 1/2014 |
| CN | 104909330 A | 9/2015 |

(Continued)

OTHER PUBLICATIONS

International Search Report and Written Opinion for International Application No. PCT/US2020/063443, dated Mar. 25, 2021 (10 pages).

*Primary Examiner* — Herve-Louis Y Assouman
(74) *Attorney, Agent, or Firm* — Van Hoven PC; Joshua Van Hoven; Stefan D. Osterbur

(57) ABSTRACT

A MEMS device, comprising a plurality of stacked layers, includes a plurality of solder couplings that mechanically fasten and electrically couple the MEMS device to an external component. The plurality of solder couplings is connected atop a portion of an upper surface that extends past an edge surface of a MEMS layer to form a shelf and are electrically connected via the shelf to receive signals generated by the MEMS device. These signals are provided to the external component via the solder couplings.

22 Claims, 11 Drawing Sheets

(56) References Cited

U.S. PATENT DOCUMENTS

2021/0179420 A1 6/2021 Hartwell
2022/0185657 A1 6/2022 Hartwell

FOREIGN PATENT DOCUMENTS

| CN | 105271100 A | 1/2016 |
| CN | 105347292 A | 2/2016 |
| DE | 102007058951 A1 | 6/2009 |
| EP | 2797113 A1 | 10/2014 |
| WO | 2021/126563 A1 | 6/2021 |

* cited by examiner

MEMS ELECTRICAL AND PHYSICAL CONNECTION VIA SOLDER COUPLINGS

CROSS REFERENCE TO RELATED APPLICATIONS

This application is a continuation-in-part of U.S. application Ser. No. 17/689,584 filed on Mar. 8, 2022, titled "On-Chip Signal Path with Electrical and Physical Connection," which is a continuation of U.S. application Ser. No. 16/717,660 filed on Dec. 17, 2019, titled "On-Chip Signal Path with Electrical and Physical Connection," the disclosures of which are incorporated herein by reference in their entireties as though set forth in full.

BACKGROUND

Numerous items such as smartphones, smart watches, tablets, automobiles, aerial drones, appliances, aircraft, exercise aids, and game controllers utilize sensors during their operation (e.g., motion sensors, pressure sensors, temperature sensors, etc.). In commercial applications, microelectromechanical system (MEMS) devices or sensors such as accelerometers and gyroscopes capture complex movements and determine orientation or direction. For example, smartphones are equipped with accelerometers and gyroscopes to augment navigation systems that rely on Global Positioning System (GPS) information. In another example, an aircraft determines orientation based on gyroscope measurements (e.g., roll, pitch, and yaw) and vehicles implement assisted driving to improve safety (e.g., to recognize skid or roll-over conditions).

As ever more products incorporate MEMS technology for a wide variety of applications, MEMS devices must integrate with numerous form factors and in miniaturized devices. A MEMS device may typically include numerous components and systems such as microelectromechanical components, analog and digital circuitry, and other associated processing circuitry for calculating outputs based on signals associated with the microelectromechanical components. In addition, these components need to be protected from the external environment, packaged, and interconnected with other components. The resulting MEMS device, although extremely small, may take up valuable space within the end-use device.

SUMMARY

In an embodiment of the present disclosure, a microelectromechanical system (MEMS) device comprises a first layer, including an upper surface, a second layer, and a third layer that couples between the upper surface of the first layer and the second layer and includes an edge surface that extends perpendicular to the upper surface, where the third layer comprises one or more MEMS components, and where the upper surface extends beyond the edge surface to form a shelf. The MEMS device further comprises a plurality of electrical connection points located on the shelf, where one or more of the plurality of electrical connection points receives signals via the first layer based on a movement of the one or more MEMS components, as well as a plurality of solder couplings, where each of the plurality of solder couplings is bonded to one of the plurality of electrical connection points, and where each of the plurality of solder couplings extends from the shelf beyond an upper surface of the second layer and is configured to attach to one or more external components above the second layer.

In an embodiment of the present disclosure, a MEMS device comprises a first layer, including an upper surface, a second layer, and a third layer that couples between the upper surface of the first layer and the second layer and includes an edge surface that extends perpendicular to the upper surface, where the third layer comprises one or more MEMS components, and where the upper surface extends beyond the edge surface to form a shelf. The MEMS device further comprises a plurality of solder couplings, where each of the solder couplings is bonded to the upper surface on the shelf, and where each of the plurality of solder couplings extends from the shelf beyond an upper surface of the second layer and is configured to attach to one or more external components above the second layer.

In an embodiment of the present disclosure, a method for physically coupling a MEMS device to an external component comprises providing a MEMS device comprising a first layer including an upper surface, a second layer, and a third layer coupled between the upper surface of the first layer and the second layer and including an edge surface that extends perpendicular to the upper surface, where the third layer comprises one or more MEMS components, and where the upper surface extends beyond the edge surface to form a shelf. The method further comprises providing an external component above the second layer, where a portion of the external component is oriented parallel to the upper surface of the shelf. Lastly, the method comprises connecting the shelf to the external component via a plurality of solder couplings, where each of the solder couplings is bonded to the upper surface on the shelf, and where each of the plurality of solder couplings extends from the shelf beyond an upper surface of the second layer and is configured to attached to the external component.

BRIEF DESCRIPTION OF DRAWINGS

The above and other features of the present disclosure, its nature, and various advantages will be more apparent upon consideration of the following detailed description, taken in conjunction with the accompanying drawings in which.

DETAILED DESCRIPTION OF THE DRAWINGS

Figure 1:
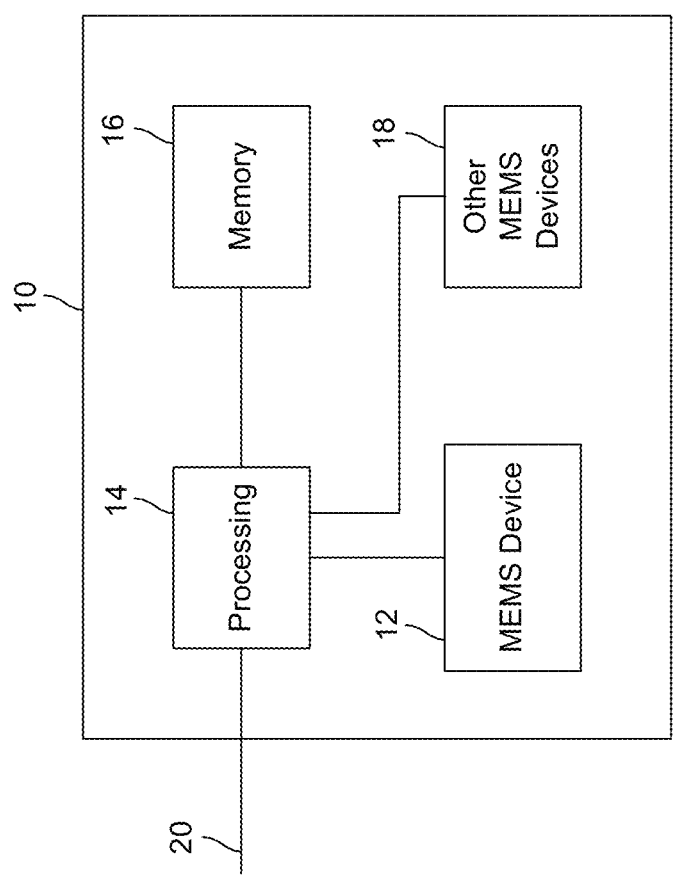
FIG. 1 shows an exemplary motion sensing system, in accordance with some embodiments of the present disclosure.

A MEMS device is fabricated using semiconductor processes and includes a plurality of stacked layers that are bonded together. One or more of the layers include microelectromechanical components that respond to a force of interest (e.g., linear acceleration, angular velocity, pressure, magnetism, ultrasonic forces, etc.) by moving in response to the force and measuring the movement to generate output signals and/or modifying electrical signals in response to the force. The microelectromechanical components are packaged within the other layers of the MEMS device. One or more of the layers of the MEMS device include circuitry that processes signals resulting from the microelectromechanical components (e.g., filtering, scaling, etc.). The resulting output signals are provided to an external surface of the MEMS device to be transmitted to other components of the end-use device for additional processing. In addition, the MEMS device also receives input signals (e.g., power signals, ground, clock signals, control signals for modifying register values, data lines for communicating, etc.). These input signals are received via an external surface of the MEMS device.

In an embodiment of the present disclosure, the layers of the MEMS device may include a MEMS layer including the microelectromechanical components and a cap and substrate layer that encapsulate the MEMS layer. One of these layers may include a plurality of electrical connection points on its external surface from which the input signals are distributed within the MEMS device and to which the output signals are provided from within the MEMS device (e.g., "internal connection points"). Another layer of the MEMS device may include a plurality of electrical connection points for connecting to other components of the end-use device (e.g., "external connection points"). Conductive paths may be formed over the external surface of the MEMS device between the internal connection points and the external connection points.

Each of the conductive paths between the internal connection points and the external connection points may be formed by a single continuous portion of material, such as Copper (Cu), Gold (Au), Nickel (Ni), Cobalt (Co), Tin (Sn), or combinations thereof. The conductive paths may extend along multiple planar surfaces that intersect at angles, such as 90° angles. For example, the conductive paths may extend along a first external planar surface including the internal connection points and be patterned to traverse an angled intersection between the first external planar surface and a second external planar surface. The conductive paths may extend along at least a portion of the second external surface, and in some embodiments, additional angled intersections and external surfaces, to form an electrical connection with the external connection points.

In an embodiment, the internal connection points may be located on a horizontally extending shelf (e.g., in an x-y plane) of the external surface of the substrate layer. The conductive paths may extend along the shelf until the shelf intersects a perpendicular vertical external surface (e.g., in a y-z plane) of the MEMS device (e.g., of the substrate layer or MEMS layer). The conductive paths may extend as continuous portions of material over the 90° angle between the horizontally extending shelf and the vertical external surface and further extend along the vertical external surface in a generally vertical direction (e.g., positive z-axis direction). The vertical external surface may include an external surface of the MEMS layer and, above the MEMS layer, an external surface of the cap layer. The conductive paths may extend over the external surface of the MEMS layer and the external surface of the cap layer (e.g., in the y-z plane perpendicular to the horizontally extending shelf), until they reach an upper external horizontal surface of the cap layer. The upper external horizontal surface of the cap layer may form a perpendicular ledge with the vertical external surface that the conductive paths may extend over (e.g., over an x-y plane of the cap layer parallel to the shelf) as continuous portions of material such that the conductive paths may further extend over the upper external horizontal surface.

The external connection points may be located over the upper external horizontal surface of the cap layer. At least one of the external connection points may provide a ground signal, e.g., that extends into the cap layer. The conductive paths may further extend along the upper external horizontal surface of the cap layer to connect to the external connection points and resulting in continuous portions of conductive material that extend directly between respective internal connection points and external connection points. The external connection points may then be connected to other circuitry of the end-use device. Solder couplings may be formed on the external connection points for direct soldering to external components such as circuit boards that route the input and output signals between the MEMS device to other components of the end-use device. In some embodiments, the solder couplings may be distributed in a particular manner (e.g., evenly distributed or other patterns) to also facilitate the physical connection between the MEMS device and the external components. The solder couplings may thus form both the physical and electrical connection between the MEMS device and other components, such that no other physical connection is needed or the solder couplings form the primary physical connection between the MEMS device and the external circuitry.

A MEMS device may connect directly to an external component via a solder coupling that extends past layers of the MEMS device in some embodiments. For example, a MEMS device may be constructed of multiple layers. Rather than connecting to an intermediate layer to connect to an external component, portions of one or more layers of the MEMS device are directly connected to the external component via solder couplings. Relatively large (e.g., ovular, elongated) solder couplings may connect between a shelf of the MEMS device (e.g., to a substrate of the MEMS device) and to the external component, providing a direct electrical and mechanical connection to the connected layer (e.g., substrate layer) of the MEMS device. The solder coupling has a height that is slightly greater than any other layer(s) located between the shelf and the external component, such that there is a minimal clearance between the MEMS device and the external component. The shelf and solder couplings may be configured in a variety of manners to provide a signal path for all necessary signals as well as to prevent movement of the MEMS device relative to the external component. In some embodiments, one or more additional smaller solder couplings may be provided on the layer closest to the external component, such as to prevent lateral movement of the MEMS device.

FIG. 1 depicts an exemplary motion sensing system 10 in accordance with some embodiments of the present disclosure. Although particular components are depicted in FIG. 1, it will be understood that other suitable combinations of sensors, processing components, memory, and other circuitry may be utilized as necessary for different applications and systems. In an embodiment as described herein, the motion sensing system may include at least a MEMS device 12 and supporting circuitry, such as processing circuitry 14 and memory 16. In some embodiments, one or more additional MEMS devices 18 (e.g., MEMS gyroscopes, MEMS accelerometers, MEMS microphones, MEMS pressure sensors, and a compass) may be included within the motion processing system 10 to provide an integrated motion processing unit ("MPU") (e.g., including 3 axes of MEMS gyroscope sensing, 3 axes of MEMS accelerometer sensing, microphone, pressure sensor, and compass).

Processing circuitry 14 may include one or more components providing necessary processing based on the requirements of the motion processing system 10. In some embodiments, processing circuitry 14 may include hardware control logic that may be integrated within a chip of a sensor (e.g., on a substrate or cap of MEMS device 12 or other MEMS device 18, or on an adjacent portion of a chip to MEMS device 12 or other MEMS device 18) to control the operation of the MEMS device 12 or other MEMS devices 18 and perform aspects of processing for the MEMS device 12 or other MEMS devices 18. In some embodiments, the MEMS device 12 and other MEMS devices 18 may include one or more registers that allow aspects of the operation of hardware control logic to be modified (e.g., by modifying a value of a register). In some embodiments, processing circuitry 14 may also include a processor such as a microprocessor that executes software instructions, e.g., that are stored in memory 16. The microprocessor may control the operation of the MEMS device 12 by interacting with the hardware control logic, and process signals received from MEMS device 12. The microprocessor may interact with other sensors in a similar manner.

Although in some embodiments (not depicted in FIG. 1), MEMS device 12 or other MEMS devices 18 may communicate directly with external circuitry (e.g., via a serial bus or direct connection to sensor outputs and control inputs), in an embodiment processing circuitry 14 may process data received from MEMS device 12 and other MEMS devices 18 and communicate with external components via communication interface 20 (e.g., a SPI or I2C bus, or in automotive applications, a controller area network (CAN) or Local Interconnect Network (LIN) bus). Processing circuitry 14 may convert signals received from MEMS device 12 and other MEMS devices 18 into appropriate measurement units (e.g., based on settings provided by other computing units communicating over the communication bus 20) and perform more complex processing to determine measurements such as orientation or Euler angles, and in some embodiments, to determine from sensor data whether a particular activity (e.g., walking, running, braking, skidding, rolling, etc.) is taking place.

In some embodiments, certain types of information may be determined based on data from multiple MEMS devices, in a process that may be referred to as sensor fusion. By combining information from a variety of sensors it may be possible to accurately determine information that is useful in a variety of applications, such as image stabilization, navigation systems, automotive controls and safety, dead reckoning, remote control and gaming devices, activity sensors, 3-dimensional cameras, industrial automation, and numerous other applications.

Each MEMS device or a combination of MEMS devices may include microelectromechanical components (e.g., of a MEMS layer) encapsulated between other layers such as a cap layer and substrate layer. For example, a MEMS layer may include microelectromechanical components that respond to the force of interest in a manner that generates signals that are processed by the MEMS device (e.g., by circuitry within a substrate layer such as a CMOS substrate layer or by a bonded processing layer of the MEMS device) to generate output signals such as analog or digital signals representing sensed motion, status signals, data signals, and control signals. The MEMS device is also supplied with input signals from external devices such as power signals, ground, clock signals, register control signals, and data lines.

Figure 2:
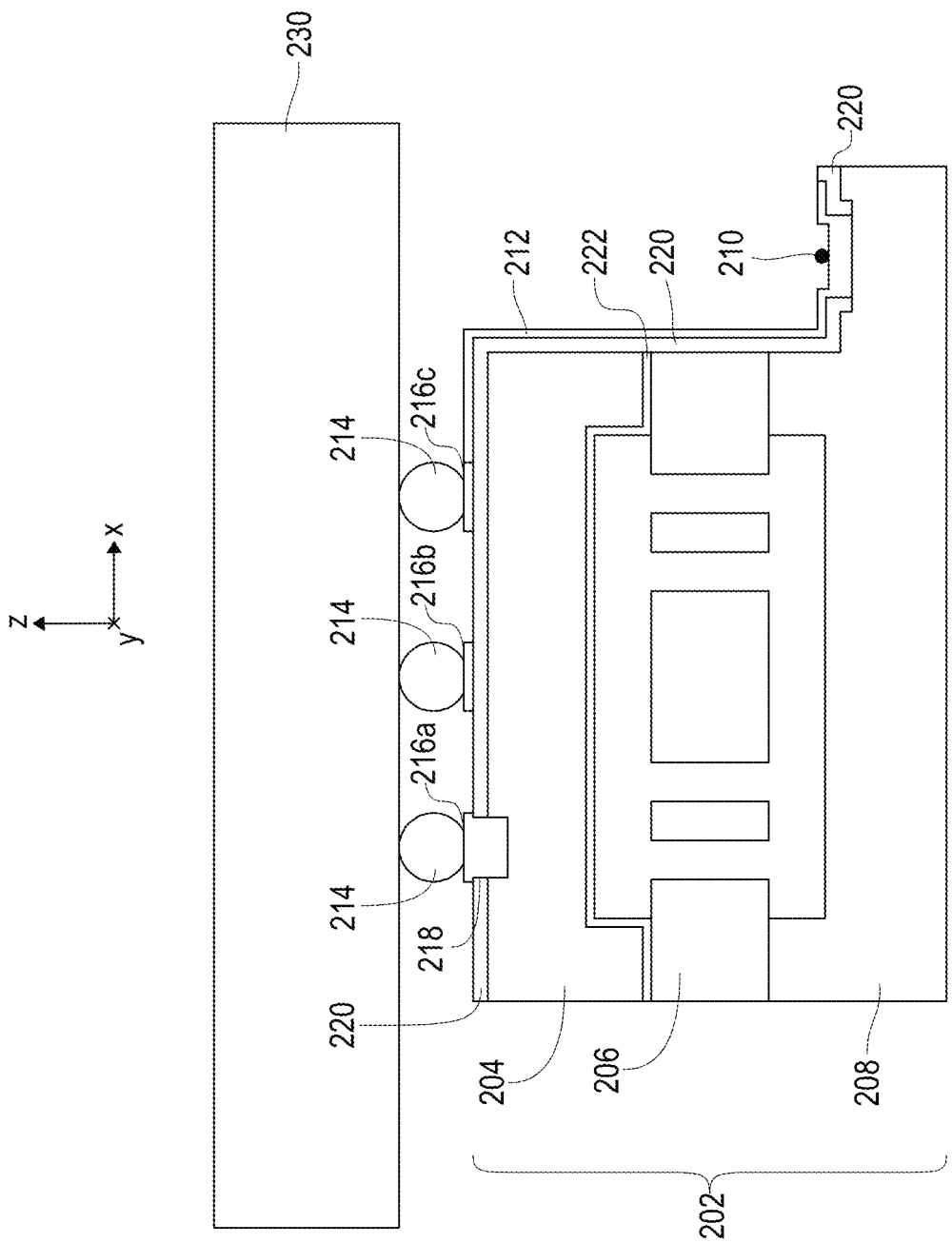
FIG. 2 depicts an exemplary MEMS device having continuous portions of material between connection points, in accordance with some embodiments of the present disclosure.

FIG. 2 depicts an exemplary MEMS device having continuous portions of material between connection points in accordance with some embodiments of the present disclosure. Although it will be understood that a MEMS device may include a variety of MEMS device types fabricated with different semiconductor layers, in the exemplary embodiment of FIG. 2, MEMS device 202 may be an inertial MEMS sensor including cap layer 204, MEMS layer 206, and substrate (e.g., CMOS) layer 208. An exemplary inertial MEMS sensor 202 may include movable electromechanical components (e.g., a suspended spring-mass system) within the MEMS layer 206 that are encapsulated within a volume by cap layer 204 and substrate layer 208.

Movement of the electromechanical components may be sensed (e.g., by capacitive sensing, piezoelectric sensing, etc.) and signals corresponding to the movement may be routed on and/or through MEMS sensor 202 to an external surface thereof. In the exemplary embodiment of FIG. 2, the signals may be routed through substrate (e.g., CMOS) layer 208 to an external shelf of substrate layer 208. In some embodiments, processing such as filtering, scaling, A/D conversion, and more complex computations (e.g., orientation, etc., as performed by an embedded ASIC) may be performed within MEMS sensor 202 (e.g., within CMOS substrate layer 208). The sensed and/or processed outputs may be provided to external connection points or bond pads 210, which may be located on a "shelf" of substrate layer 208 that extends beyond the other layers of MEMS sensor 202 within the x-y plane.

In an embodiment of the present disclosure, an isolation layer 220 (e.g., a WPR photoresist) may overlay portions of substrate layer 208 (e.g., of the shelf of the substrate layer and vertically extending portion from the shelf), MEMS layer 206 (e.g., an external-facing portion of the MEMS layer 206), and cap layer 204 (e.g., a top and sides of the cap layer 204). In some embodiments, the isolation layer 220 may include multiple layers and/or different materials at different portions of the external surfaces of the sensor layers 204/206/208, or in some embodiments, there may be no isolation layer 220 or other layer types may be included with or substituted for isolation layer 220.

In an exemplary embodiment of the particular layers and configuration of MEMS sensor 202, continuous portions of material also referred to as a redistribution layer 212 may extend from respective electrical connection points 210 along the x-y plane of the external surface of the shelf of substrate layer 208 generally in the x-direction and traverse a 90° angle between the external x-y planar surface of substrate layer 208 and the external y-z planar surface of substrate layer 208. The continuous portions of material 212 may then extend generally in the z-direction in the y-z planes of the external surfaces of substrate layer 208, MEMS layer 206, and cap layer 204. Once the continuous portions of material 212 encounters the top (along the z-axis) surface of cap layer 204, the continuous portions of material 212 may traverse the 90° angle between the external y-z planar surface of cap layer 204 and the top external x-y planar surface of cap layer 204.

Once over the external x-y planar surface of cap layer 204, the continuous portions of material 212 may extend along the x-y planar surface to respective electrical connection points 216. In the embodiment depicted in FIG. 2, a first continuous portion of material connects to electrical connection point 216a, while second and third continuous portions of material (not depicted) connect to electrical connection points 216a and 216b, respectively. In this manner, direct electrical connections may be made between respective electrical connection points 210 on the external surface of CMOS layer 208 and associated electrical connection points 216 on the external surface of cap layer 204. Electrical connection points 216 may be coupled to other components 230 of an end-use device. In the exemplary embodiment of FIG. 2, solder balls 214 form a soldered connection between other components 230 and cap layer 204 of MEMS sensor 202. Solder balls 214 form direct electrical and physical connections between MEMS sensor 202 and other components 230, providing processed and/or raw outputs from MEMS sensor 202 for use by other systems of the end-use device. The electrical connections provided by solder balls 214 also allow signals to be provided from other components 230 to MEMS sensor 202. Exemplary signals to be provided to MEMS sensor 202 include power signals, ground signals, clock signals, control signals (e.g., register control signals), and data signals exchanged according to a protocol. These signals are in turn distributed to appropriate components of the MEMS package via solder balls 214 to respective external electrical connection points 216, via associated continuous portions of material 212 to external electrical connection points 210, and via substrate (e.g., CMOS) layer 208, to the internal components of MEMS sensor 202. Some signals (e.g., ground and/or power signals) may be provided directly to cap layer 204, as depicted by cap electrical connection 218. In the exemplary embodiment of FIG. 2, the cap layer 204 is insulated from the other layers of the MEMS device 202 by an insulating layer 222 (e.g., an oxide insulating layer).

In comparison to conventional MEMS devices, the exemplary embodiment of FIG. 2 does not require an additional package layer or bonding thereto for electrical or physical connection to the external components. Removing the intermediate package layer reduces the overall size of the packaging of the MEMS sensor, as well as reducing cost and removing fabrication steps. In addition, because the continuous portions of material are fabricated directly over the external non-conductive surfaces of the layers of the MEMS sensor, there is no need for wire bond connections between any layers of the MEMS sensor. Further, the continuous portions of material are patterned and located such that they will not come into contact with each other and are unlikely to come into contact with other external conductive components. An additional insulating layer may also be formed directly over the continuous portions of material. Accordingly, epoxy is not required for securing and protecting wire bonds. Removing this additional material reduces the overall size of the sensor, reduces cost, and eliminates manufacturing steps. The reduced size and weight of the MEMS sensor of FIG. 2 allows the MEMS sensor to be placed in ever-smaller environments with more precision. Further, the direct connection by the solder couplings to the cap layer securely attach the MEMS sensor to the other components. In combination with the reduced height and profile of the MEMS sensor, the forces imparted on the solder coupling are substantially reduced.

The external surfaces of the layers of MEMS sensor 202 may be non-conductive and in some embodiments additional layers of non-conductive material (e.g., a photo-resist layer 220) may be deposited on the external surfaces of MEMS sensor 202 that have the continuous portions of material fabricated thereon (e.g., a photo-resist 220 patterned on the x-y shelf and adjacent y-z planar surface of substrate layer 208, y-z planar surface of MEMS layer 206, and y-z planar surface and adjacent x-y planar surface of cap layer 204). Exemplary materials for the continuous portions of material include Copper (Cu), Gold (Au), Nickel (Ni), Cobalt (Co), or Tin (Sn), and Aluminum (Al).

Figure 3:
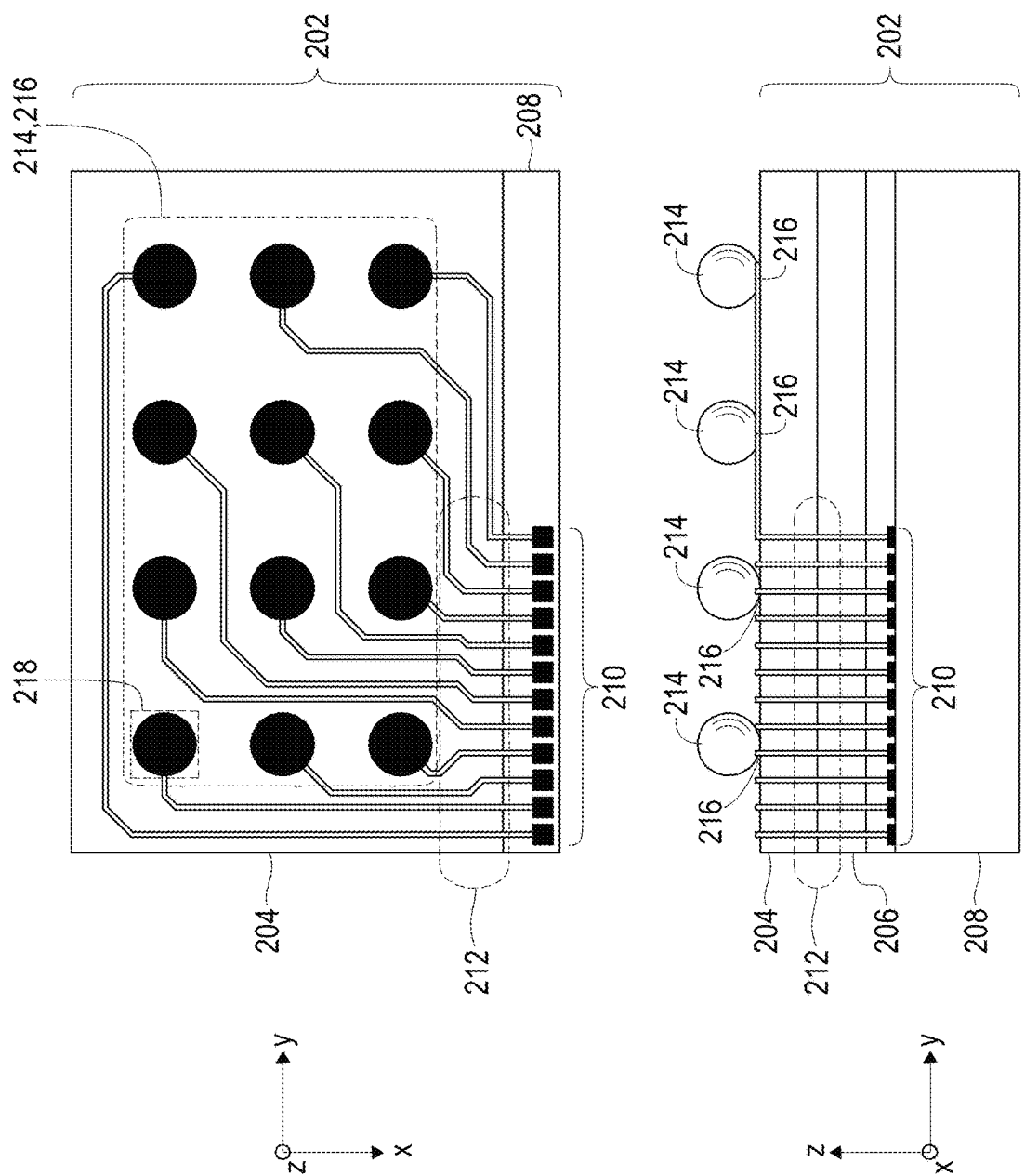
FIG. 3 depicts exemplary top and front views of the exemplary MEMS device of FIG. 2, in accordance with some embodiments of the present disclosure.
Figure 4:
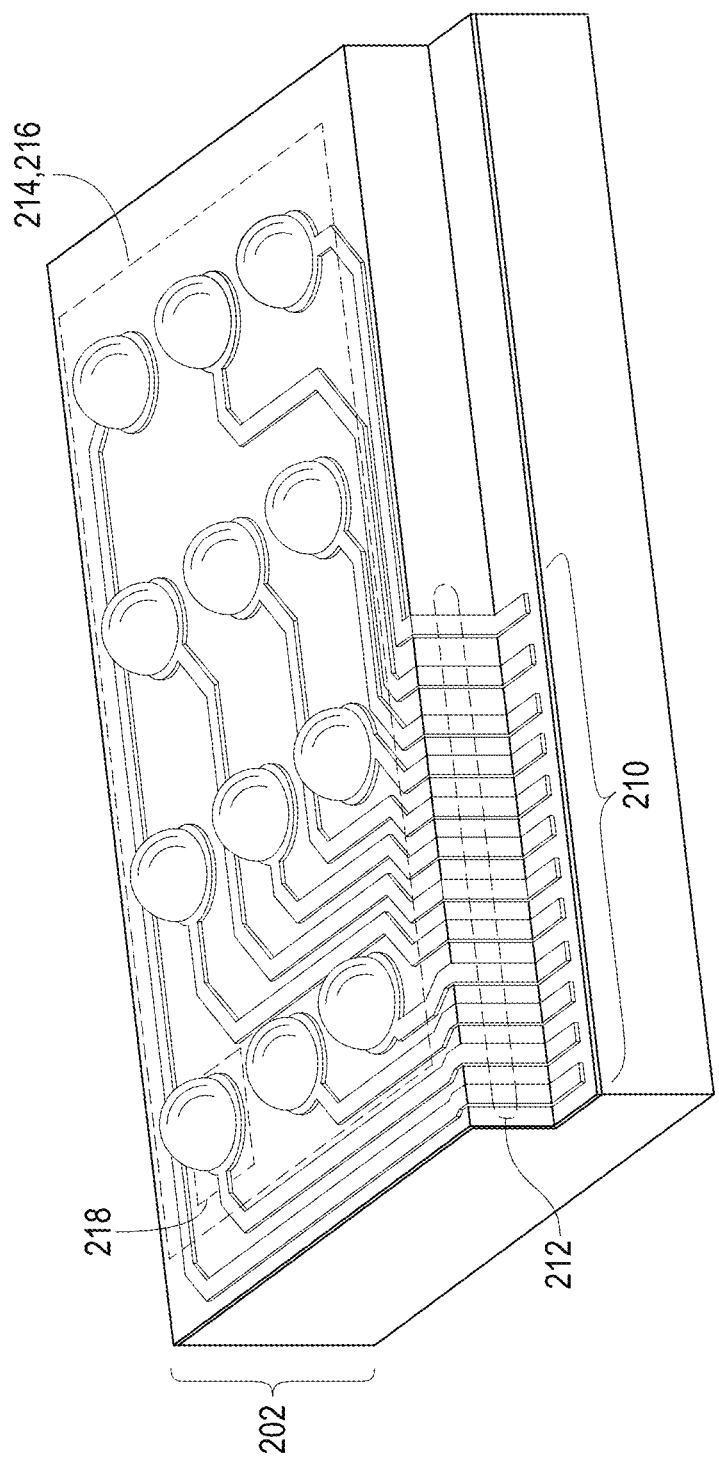
FIG. 4 depicts an exemplary perspective view of the exemplary MEMS device of FIGS. 2-3, in accordance with some embodiments of the present disclosure.

Although FIG. 2 and FIGS. 3-4 herein are described in the context of a particular MEMS device type and configuration, the disclosure of the present application may apply to a variety of different applications. In addition to MEMS sensors, the present disclosure may be applied to a variety of MEMS devices. Moreover, while the substrate layer is described herein as the layer that provides electrical connection between the external connection points and the internal components of the MEMS sensor, such electrical connections and connection points may be provided on other layers and/or multiple layers of a MEMS sensor. Furthermore, additional layers (e.g., an ASIC processing layer bonded to the substrate layer) may be provided in addition to the 3-layer MEMS sensor described herein. In some embodiments, more than two layers may include electrical connection points. For example, some continuous portions of material may provide direct electrical connections only between layers of the MEMS sensor, while some continuous portions of material may provide direct electrical connections to the external components. Different configurations of layers may have no shelf or multiple shelfs, and in some embodiments, transitions between planar surfaces may be at angles other than 90°.

FIG. 3 depicts exemplary top and front views of the exemplary MEMS device of FIG. 2 in accordance with some embodiments of the present disclosure. In the exemplary embodiment of FIG. 3, first electrical connection points 210 are configured in a single uniform row on the shelf of substrate layer 208. In some embodiments, other configurations including multiple rows of electrical connection points, an even distribution of electrical connection points, and other patterns may be utilized (e.g., to correspond with associated components within MEMS sensor 202). The continuous portions of material 212 are connected to a respective one of the electrical connection points 210 and extend along the x-y plane of substrate layer 208 in the direction of the y-z vertical planar surface of substrate layer 208. Although in the exemplary embodiment of FIG. 3 the continuous portions of material 212 extend along the x-y planar external surface of substrate 208 solely in the x-direction, in other embodiments (e.g., based on respective locations of electrical connection points 210) the continuous portions of material 212 may extend within the x-y plane in both the x-direction and y-direction.

The continuous portions of material 212 traverse a 90° angle between the external x-y planar surface of substrate layer 208 and the external y-z planar surface of substrate layer 208. In the exemplary embodiment of FIG. 3, the continuous portions of material 212 may then extend in the z-direction over the y-z planar external surfaces of substrate layer 208, MEMS layer 206, and cap layer 204, until reaching the top x-y external surface of the cap layer. In some embodiments (not depicted in FIG. 3), the continuous portions of material 212 may extend in both the y-direction and z-direction while generally extending in the z-direction, for example, to require less travel along the x-y planar external surface of cap layer 204 to connect to electrical connection points 216.

The continuous portions of material 212 traverse a 90° angle between the external y-z planar surface of cap layer 204 and the external x-y planar surface of cap layer 204. In the exemplary embodiment of FIG. 3, electrical connection points 216 and solder balls 214 connected thereto may be evenly distributed about the top x-y external planar surface of cap 204. In other embodiments (not depicted in FIG. 3), electrical connection points 216 and solder couplings (e.g., solder balls 214) may be distributed in other patterns for desired electrical and physical connections, for example, with a substantial percentage of the electrical connection points 216 and solder balls 214 near corners of the MEMS sensor 202, along the exterior of the MEMS center, bunched near the center of MEMS sensor 202, or distributed to correspond to preexisting connection points of the other components of the end use device. In this manner, the particular pattern of electrical connection points 216 and solder balls 214 may be customized to particular applications, MEMS sensor shapes/sizes, and expected stresses incurred from the other components. Although the present disclosure may generally refer to solder couplings (e.g., solder balls) as forming the electrical and physical connections between the electrical connection points of the MEMS device and the other components, it will be understood that other electromechanical methods of forming conductive physical connections between components may be utilized.

As depicted in FIG. 3, the continuous portions of material 212 may extend along the x-y planar surface of cap layer 204 to respective electrical connection points 216. In this manner, direct electrical connections may be made between respective electrical connection points 210 on the external surface of CMOS layer 208 and associated electrical connection points 216 on the external surface of cap layer 204. Paths for the continuous portions of material 212 over the top x-y planar external surface may be selected on a number of bases, including based on respective y-axis locations where the continuous portion of material extends from the y-z external planar surface of cap layer 204 to the x-y planar surface of cap layer 204, locations of electrical connection points 216, and desired electrical and RF characteristics, such as avoiding undesired RF emissions or functioning as a shield to electromagnetic interference sources.

FIG. 4 depicts an exemplary perspective view of the exemplary MEMS device of FIGS. 2-3 in accordance with some embodiments of the present disclosure. The perspective view of FIG. 5 demonstrates the completed MEMS sensor 202 before connection to the other components via solder balls 214. The layers of the MEMS sensor 202 are not visible, as additional layers such as a photo-resist layer have been applied to the external surfaces of the MEMS sensor prior to application of the continuous portion of material 212.

Figure 5:
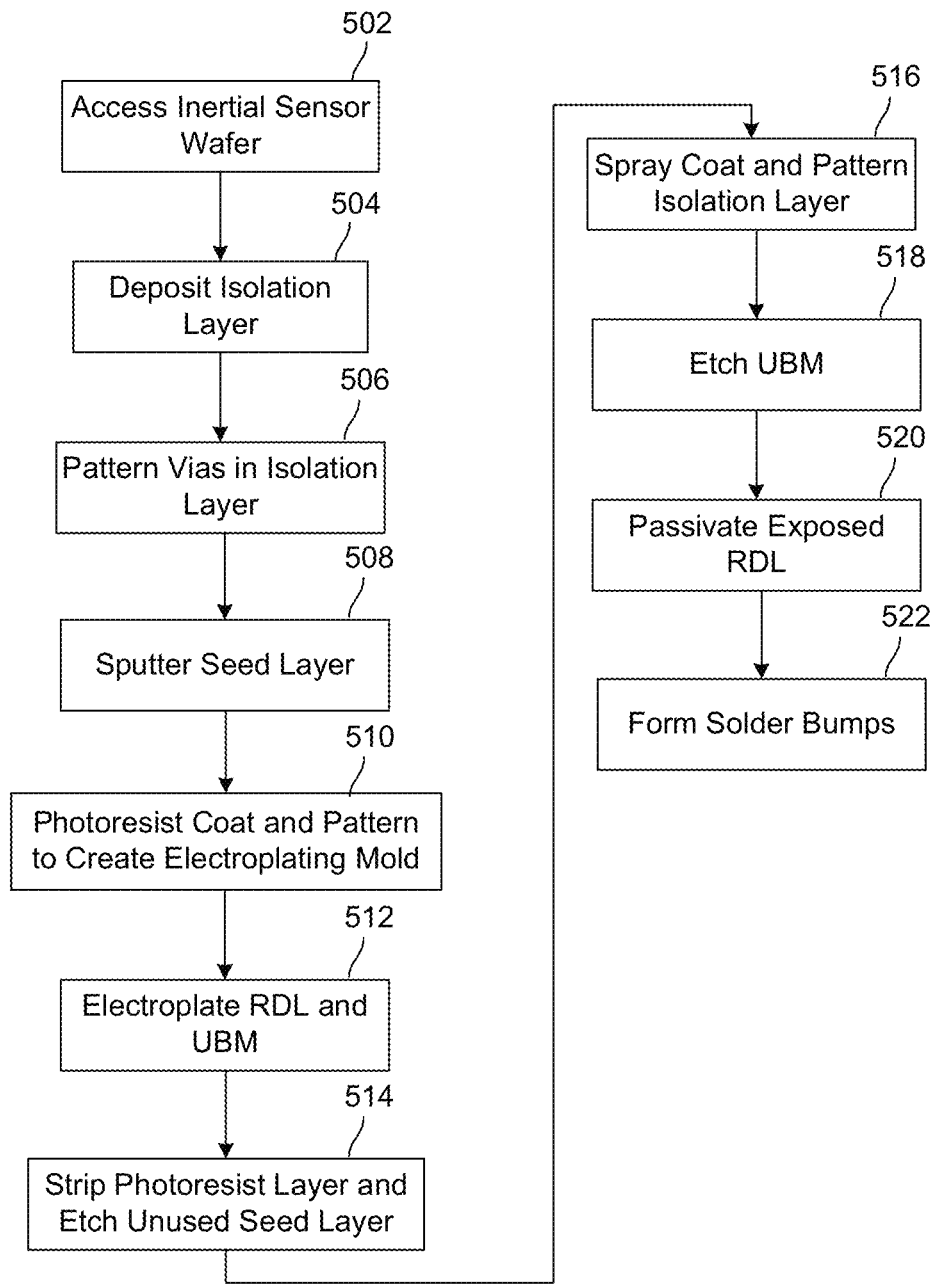
FIG. 5 depicts exemplary steps for fabricating a MEMS device having continuous portions of material between connection points, in accordance with some embodiments of the present disclosure.

FIG. 5 depicts exemplary steps for fabricating a MEMS device having continuous portions of material between connection points in accordance with some embodiments of the present disclosure. Although FIG. 5 is described in the context of the present disclosure, it will be understood that the methods and steps described in FIG. 5 may be applied to a variety MEMS designs having direct electrical connections, sensing element types, processing circuitry, and measurement techniques. Although a particular order and flow of steps is depicted in FIG. 5, it will be understood that in some embodiments one or more of the steps may be modified, moved, removed, or added, and that the flow depicted in FIG. 5 may be modified.

At step 502, a wafer of MEMS devices (e.g., MEMS inertial sensors) may be accessed. In an exemplary embodiment, the wafer may have previously undergone processing to fabricate and bond the respective layers (e.g., cap layer, MEMS layer, and CMOS layer) of the MEMS device and may include locations for placement of electrical connection points.

At step 504, an isolation layer (e.g., WPR photoresist) may be deposited by spray coating on exposed surfaces of the MEMS devices of the wafer. In an exemplary embodiment, the substrate (e.g., CMOS) layer of the MEMS device may be located at the lower surface of the wafer with the MEMS layer and cap layer located at progressively greater distances from the lower surface. The exposed surfaces may include any exposed portions of these layers, including, for example, a horizontal shelf of the substrate layer, vertical surfaces of all three layers, and an upper horizontal surface of the cap layer.

At step 506, the isolation layer may be patterned to create trenches in the isolation layer. The trenches may expose one or more locations such as electrical connection points of the substrate (e.g., CMOS layer) and cap layers and/or provide locations for conductive paths between electrical connection points, as well as other sensor portions such as a ground plane of a cap layer. In an exemplary embodiment, only a subset of the electrical connection points requiring direct access to the surface of the MEMS device (e.g., at a shelf of a substrate layer and/or a subset of electrical connection points of the cap layer) may be patterned.

At step 508, a seed layer (e.g., a Ti/Cu seed layer) may be applied (e.g., sputtered) over the isolation layer and exposed portions of the MEMS device (i.e., the trenches). At step 510, an electroplating photo resist mold may be applied, for example, by spray coating. The electroplating photo resist is later patterned. In an exemplary embodiment, the spray coating may cover the seed layer and isolation layer, and the patterning of the electroplating photoresist may correspond to the locations of the electrical connection points and the conductive paths therebetween. As a result of the creation of the electroplating mold, some electrical connection points (e.g., for a shelf of a substrate layer and power supply to a cap layer) may be exposed through the isolation layer (applied at step 504) and some electrical connection points and conductive paths (e.g., electrical connection points of the cap layer and conductive paths that that connect between other devices and the electrical connection points of the substrate layer) may be patterned over the isolation layer.

At step 512, a redistribution layer (e.g., conductive paths of continuous portions of material 212 such as a Cu/Ni layer) followed by electrical connection points 210 and 216 (e.g., an under-bump metallization layer such as Au) may be electroplated in the patterned locations of the electroplated mold to form and electrically connect the electrical connection points and conductive paths (i.e., continuous portions of material) between the electrical connection points.

At step 514, the photoresist applied at step 510 may be stripped and unused portions of the seed layer (e.g., not having the redistribution layer and under-bump metallization layer applied over the seed layer) may be etched, exposing the isolation layer, redistribution layer, and under-bump metallization layer.

At step 516, an additional isolation (e.g., photoresist) layer may be spray coated over the exposed layers and patterned, e.g., to facilitate exposure of the connection points 210 and 216 (e.g., under-bump metallization). At step 518, the connections points 210 and 216 (e.g., under-bump metallization) may be etched. At step 520, the any exposed portions of the conductive paths (e.g., redistribution layer) may be electrically passivated (e.g., using plasma). At step 522, electrical connections such as solder bumps may then be formed over the exposed connection points (e.g., under-bump metallization of the cap), providing physical and electrical connections to other components. The wafers may then be diced to create the individual MEMS devices for integration with the other components in an end use device.

Figure 6:
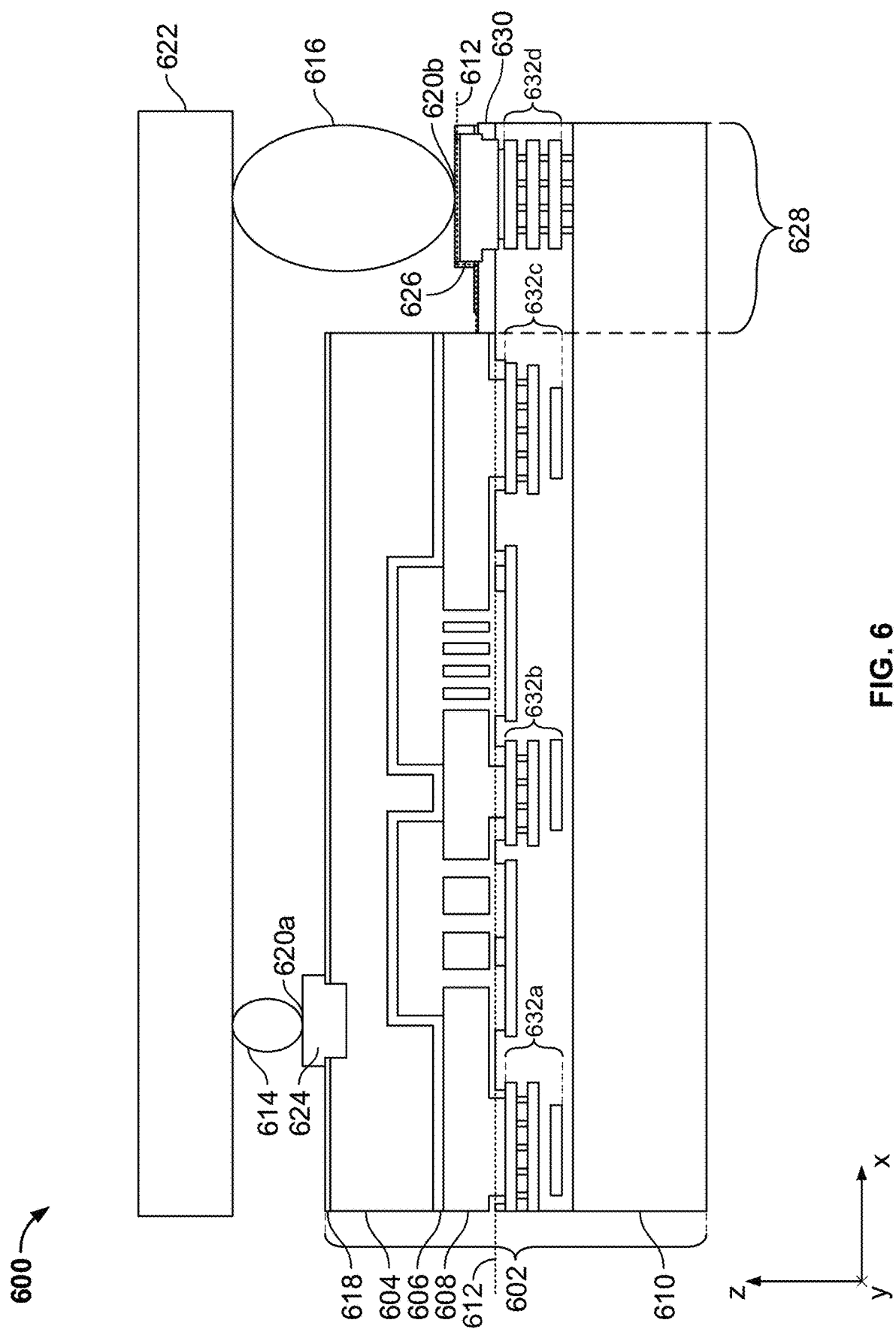
FIG. 6 shows a side section view of an illustrative MEMS device including solder couplings extending from a shelf of the MEMS device to connect to an external component, in accordance with some embodiments of the present disclosure.

FIG. 6 shows a side section view of an illustrative MEMS device including solder couplings extending from a shelf of the MEMS device to connect to an external component, in accordance with some embodiments of the present disclosure. Although it will be understood that the MEMS device may include a variety of MEMS device types fabricated with different semiconductor layers, in the exemplary embodiment of FIG. 6, MEMS device 602 may be an inertial MEMS sensor including a substrate (e.g., a first) layer 610, an upper surface 612 of substrate 610, a MEMS (e.g., third) layer 608, and a cap (e.g., second) layer 604. System 600 may further include insulating layer 606, cap solder coupling 614, shelf solder coupling 616, cap isolation layer 618, electrical connection points 620a, 620b, external component 622, cap electrical connection 624, shelf electrical connection(s) 626, shelf 628, and shelf isolation layer 630. In some embodiments, cap 604 is attached to MEMS layer 608 by fusion bond 606. Shelf 628 is a portion of the substrate layer 610 that extends within the substrate layer 610 perpendicular to an edge of MEMS layer 608. Although particular components are depicted in certain configurations for system 600, it will be understood that components may be removed, modified, or substituted and that additional components (e.g., electrical connections, solder couplings, processing circuitry, etc.) may be added in certain embodiments.

An exemplary inertial MEMS device 602 may include movable electromechanical components (e.g., a suspended spring-mass system) within MEMS layer 608 that are encapsulated within a volume by cap layer 604 and substrate layer 610. Upper surface 612 defines an upper surface of the substrate layer 610 (e.g., prior to bonding to MEMS layer 608) and includes any components of the substrate layer that extend therefrom or are patterned within the substrate layer.

In FIG. 6, upper surface 612 is depicted in a simplified manner as a dashed line generally conforming to this upper surface.

In some embodiments, substrate layer 610 includes circuitry such as circuitry 632a, 632b, 632c, and 632d to receive signals based on movements of components within the MEMS layer 608. The circuitry may be processing circuitry, such as processing circuitry 632a, 632b, 632c, and 632d, e.g., that may provide electrical paths and aspects of control and signal processing for the MEMS device 602. In an embodiment, processing circuitry 632a, 632b, and 632c may receive and process signals based on movements of components within the MEMS layer 608 (e.g., movements of a proof mass of a suspended spring-mass system relative to one or more fixed electrodes), process those received signals, and provide processed signals via internal electrical connections of substrate 610 (not depicted) to processing circuitry 632d, such that electrical connection point(s) 620b, electrically coupled to processing circuitry 632d, are in electrical connection with processing circuitry 632a, 632b, and 632c to transmit signals between processing circuitry 632a, 632b, and 632c and external component(s) 622 connected to electrical connection point(s) 620b.

MEMS device 602 is a MEMS device such as an inertial MEMS sensor, which includes cap (e.g., second) layer 604, MEMS (e.g., third) layer 608, upper surface 612, and substrate (e.g., first) layer 610, that, in some embodiments, may include movable electromechanical components within MEMS layer 608 capable of responding to a force of interest in a particular direction (e.g., linear acceleration, angular velocity, pressure, acoustic waves, etc.) and generating, in response to the expected force, sense signals corresponding to a movement (e.g., changes in capacitive engagement) of the electromechanical components. In some embodiments, processing circuitry 632a, 632b, and 632c of substrate layer 610 provides electrical pathways and signal processing that allows MEMS device 602 to process the sense signals corresponding to the movement of the internal MEMS components, and provide them as electrical signals to processing circuitry 632d, such that electrical connection point(s) 620b, electrically coupled to processing circuitry 632d, are in electrical connection with processing circuitry 632a, 632b, and/or 632c to transmit signals between the processing circuitry 632a, 632b and/or 632c and external component 622 for use by other systems of an end-use device. The sensed and/or processed outputs may be provided to shelf solder coupling(s) 616 (e.g., solder ball(s)) via electrical connection point(s) 620b, which may be located on shelf 628 where upper surface 612 extends beyond an edge surface of MEMS layer 608 within the x-y plane. It will be understood that there may be a variety of suitable configurations of electrical connection points 620b on shelf 628 within the upper x-y plane of shelf 628, where the number of electrical connection points 620b generally corresponds to the number of shelf solder couplings 616 (e.g., one for each in some embodiments, although in some embodiments of a shared electrical connection, multiple solder couplings may be connected to a single electrical connection point, or vice versa). The solder couplings 616 electrically and mechanically connect MEMS device 602 to external component 622. Processing such as filtering, scaling, A/D conversion, and more complex computations (e.g., orientation, etc., as performed by an embedded ASIC) may be performed within MEMS device 602 (e.g., within processing circuitry 632a, 632b, and 632c of the substrate layer 610) or by components connected via the external component, as appropriate.

In certain embodiments, cap (e.g., second) layer 604 is located directly above MEMS (e.g., third) layer 608 and, in an embodiment, can form a direct electrical and mechanical connection with electrical connection point(s) 620a via a cap electrical connection 624. It will be understood that there may be any number of electrical connection points 620a on the upper surface cap layer 604 along a suitable surface (e.g. the upper x-y plane), where the number of electrical connection points 620a generally corresponds to the number of cap solder couplings 614. In the embodiment depicted in FIG. 6, cap 604 is electrically and mechanically connected to an external component 622 via solder coupling 614. In this manner, a remote point (or points) of mechanical connection can be utilized with respect to the soldering couplings 616 located on shelf 628. In this manner, the larger solder couplings 616 can provide a relatively strong vertical physical connection to the external component while the smaller solder coupling 614 maintains relative (e.g., x-y plane) position without imparting excess stress on the MEMS device 602 packaging. In some embodiments, additional solder couplings 614 may be included, providing further rigidity to x-y plane movement. In other embodiments, there may be no solder couplings 614 to the cap layer, as configurations of solder couplings 616 to the shelf (or shelves) may provide adequate coupling in all directions.

As depicted in FIG. 6, cap layer 604 forms a soldered connection with cap solder coupling(s) 614 (e.g., solder ball(s)) and, in some embodiments, may form a soldered connection with a plurality of cap solder couplings. In some embodiments, external component 622 may provide signals (e.g., ground, power, or other signals) directly to cap layer 604 via cap solder couplings 614 and cap electrical connection 624. Insulating layer 606 (e.g., an oxide layer) insulates cap layer 604 from the remaining layers (e.g., MEMS layer 608, upper surface 612, and substrate layer 610) of MEMS device 602. Cap isolation layer 618 (e.g., a photoresist layer), which includes a non-conductive material, overlays the top of cap layer 604 along the x-y plane. In some embodiments, cap isolation layer 618 may include multiple layers and/or different materials at different portions of the external surface of cap layer 604. In some embodiments, there may be no cap isolation layer 618 or other layer types may be included or substituted for cap isolation layer 618. In an embodiment, cap solder coupling 614, which forms a soldered connection between external component 622 and cap layer 604, is positioned at least half the width of cap layer 604 away from a first edge of cap layer 604 along the y-z plane adjacent to shelf solder coupling 616. In some embodiments, cap solder coupling 614 may be positioned at least three-fourths the width of cap layer 604 away from the first edge of cap layer 604 along the y-z plane adjacent to shelf solder coupling 616, or other distances as appropriate to provide suitable x-y plane support to the MEMS device. In the embodiment of FIG. 6, cap solder coupling 614, via electrical connection point 620a and electrical connection 624, is grounded to cap layer 604. While electrical connection point 620a couples cap solder coupling 614 to cap electrical connection 624, it will be understood that, in some embodiments, electrical connection point 620a may directly couple to external component 622. In some embodiments, a plurality of cap solder couplings 614 may extend in a uniform row along the x-y planar surface of cap isolation layer 618.

MEMS (e.g., third) layer 608 is encapsulated by substrate layer 610 and cap layer 604. In some embodiments, MEMS layer 608 may include movable electromechanical components (e.g., a suspended spring-mass system) that capacitively engage in response to an expected force (e.g., linear acceleration, angular velocity, pressure, acoustics, etc.) and accordingly produce sense signals that are routed, via substrate layer 610, to shelf electrical connection(s) 626. In some embodiments, the electromechanical components of MEMS layer 608 may receive signals (e.g., power signals, ground signals, clock signals, control signals, data signals, etc.) from external component 622. Upper surface 612 is located between MEMS layer 608 and other components of substrate layer 610, which includes processing circuitry 632a, 632b, and 632c (e.g., upper surface MEMS components) as well as shelf 628. In some embodiments, processing circuitry (e.g., processing circuitry 632a, 632b, and 632c) monitors the movement (e.g., capacitive engagement) of electromechanical components in MEMS layer 608 in response to expected forces (e.g., linear acceleration, angular velocity, pressure waves, acoustic signals, etc.), provides electrical pathways and signal processing to substrate layer 610, and delivers sense signals, corresponding to the movement of the MEMS components, to processing circuitry (e.g., processing circuitry 632d within shelf 628), such that electrical connection point(s) 620b of shelf 628, which is electrically coupled to processing circuitry 632d, is in electrical connection with processing circuitry (e.g., processing circuitry 632a, 632b and/or 632c) to transmit signals, via shelf electrical connection(s) 626 and shelf solder coupling(s) 616, between the processing circuitry and external component 622 for use by the end-use device.

Upper surface 612 extends beyond an edge surface of MEMS layer 608 to form a shelf 628 along the x-y plane, which houses shelf isolation layer 630, shelf electrical connection(s) 626, electrical connection point(s) 620b, and shelf solder coupling(s) 616 (e.g., solder ball(s)). It will be understood that the edge surface of MEMS layer 608, which extends along a y-z planar surface of MEMS layer 608, is perpendicular with the portion of upper surface 612 that forms the shelf. In some embodiments, upper surface 612 may extend beyond a second edge surface of MEMS layer 608, at an opposite or adjacent portion of substrate layer 610 from another edge surface of MEMS layer 608, to form a second shelf (e.g., opposite and/or adjacent to substrate layer 610 from shelf 628). Shelf 628 receives sense signals (e.g., generated by the capacitive engagement of electromechanical components within MEMS layer 608), via substrate layer 610, in response to an expected force and routes the sense signals to shelf solder coupling(s) 616, via shelf electrical connection(s) 626 and electrical connection point(s) 620b.

Shelf isolation layer 630, which includes a non-conductive material (e.g., WPR photoresist), overlays a portion of upper surface 612 that extends past the edge surface of MEMS layer 608 to form the shelf. In some embodiments, shelf isolation layer 630 may include multiple layers and/or different material at different portions of the external surface of upper surface 612. In some embodiments, there may be no shelf isolation layer 630 or other layer types may be included with or substituted for shelf isolation layer 630. Shelf isolation layer 630 is perpendicular with the edge surface of MEMS layer 608 and extends along the x-y planar surface of upper surface 612 such that it is parallel with cap isolation layer 618 along the x-y plane.

Shelf solder coupling(s) 616 (e.g., solder ball(s)), which electrically connect to shelf 628 via shelf electrical connection(s) 626 and electrical connection point(s) 620b, extend beyond isolation layer 618 of cap layer 604 to form a soldered connection between external component 622 and upper surface 612. Shelf solder coupling(s) 616 form direct electrical and physical connections between MEMS device 602 and external component 622, providing processed and/or raw output signals from MEMS device 602 (e.g., from movable electromechanical components in MEMS layer 608) to external component 622 for use by other systems of the end-use device (e.g., accelerometer, gyroscope, etc.). In some embodiments, via the electrical connection provided by shelf solder coupling(s) 616, external component 622 may deliver signals (e.g., power signals, ground signals, clock signals, control signals, data signals, etc.) to MEMS device 602, where the received signals are distributed to appropriate components (e.g., internal electromechanical components) of MEMS device 602 via shelf 628 and substrate layer 610. In some embodiments, a plurality of shelf solder couplings 616 may be configured in a single, uniform row on the shelf 628 of upper surface 612 along the x-y plane, where each shelf solder coupling 616 of the plurality of shelf solder couplings 616 connects to an electrical connection point 620b of a plurality of electrical connection points 620b. In some embodiments, other configurations (e.g., multiple rows of shelf solder couplings 616, an even distribution of shelf solder couplings 616, and other patterns) may be utilized (e.g., to correspond with associated components within MEMS device 602). In some embodiments, the shelf solder coupling(s) 616 may have an ovular shape, and, in further embodiments, the shelf solder coupling(s) 616 may have a variety of shapes (e.g., rectangular, trapezoidal, hexagonal, etc.) to electrically and securely connect external component 622 to MEMS device 602. In some embodiments, shelf solder coupling 616 may be made of a variety of conductive metals or materials (e.g., lead, silver, copper, gold, aluminum, nickel, zinc, brass, iron, tin, etc.) or any combination thereof (e.g., a variety of conductive alloys). It will be understood that a second plurality of shelf solder couplings may be configured in a uniform row on shelf 628 or on a second shelf of upper surface 612, along the x-y plane, that extends past a second edge surface of MEMS layer 608 on an opposite side of substrate layer 610. In some embodiments, the second shelf of upper surface 612 that extends past a second edge surface of MEMS layer 608 may be on an adjacent side of substrate layer 610 adjacent and perpendicular to the first shelf 628. External component 622 (e.g., package substrate) directly connects to cap layer 604, via cap solder coupling 614, and to upper surface 612, via shelf solder coupling 616, allowing external component 622 to either deliver or receive signals from MEMS device 602. In some embodiments, the end-use device may couple to external component 622, where external component 622 may deliver received sense signals from MEMS device 602 to the end-use device. In other embodiments, external component 622 may deliver received signals from the end-use device to MEMS device 602.

The exemplary embodiment of FIG. 6 does not require an additional package layer or bonding thereto for electrical or physical connection to the external component 622. Removing the intermediate package layer reduces the overall size of the packaging of MEMS device 602, removes fabrication steps, and reduces cost. For example, because processing is performed at a wafer level on the MEMS device, the overall cost of production and material cost is substantially reduced. The reduced size and weight of MEMS device 602 allows MEMS device 602 to be placed in ever-smaller environments with more precision. In addition, the direct connection by solder couplings to cap layer 604 and upper surface 612 securely attach MEMS device 602 to external component 622. In combination with the reduced height and profile of MEMS device 602, the forces imparted on the solder couplings are substantially reduced.

Although FIG. 6 and FIGS. 7-12 are described herein in the context of a particular MEMS device type and configuration, the disclosure of the present application may apply to a variety of different applications. It will be understood that the present disclosure may apply to a variety of MEMS devices. Moreover, while the substrate layer is described as the layer that provides electrical connection between internal MEMS components of MEMS layer 608 and solder coupling 616, such electrical connections may be provided via other layers and/or multiple layers of MEMS device 602. Furthermore, additional layers (e.g., an ASIC processing layer bonded to substrate layer 610) may be provided in addition to the 3-layer MEMS device described herein. Different configurations of layers may have multiple shelves and, in some embodiments, transitions between planar surfaces may be at angles other than 90 degrees. Although larger solder couplings have been described as connecting to a shelf of a substrate layer of a MEMS device located opposite the external component, in some embodiments the orientation of the MEMS device and location of the shelf may be modified. For example, the substrate layer may be located proximate the external component (rather than the cap layer) while the cap layer is located opposite the external component with a shelf for connection via large soldering couplings. Signals may be passed directly to such a substrate layer via smaller couplings to the external component or indirectly via the large solder couplings and the cap.

Figure 7:
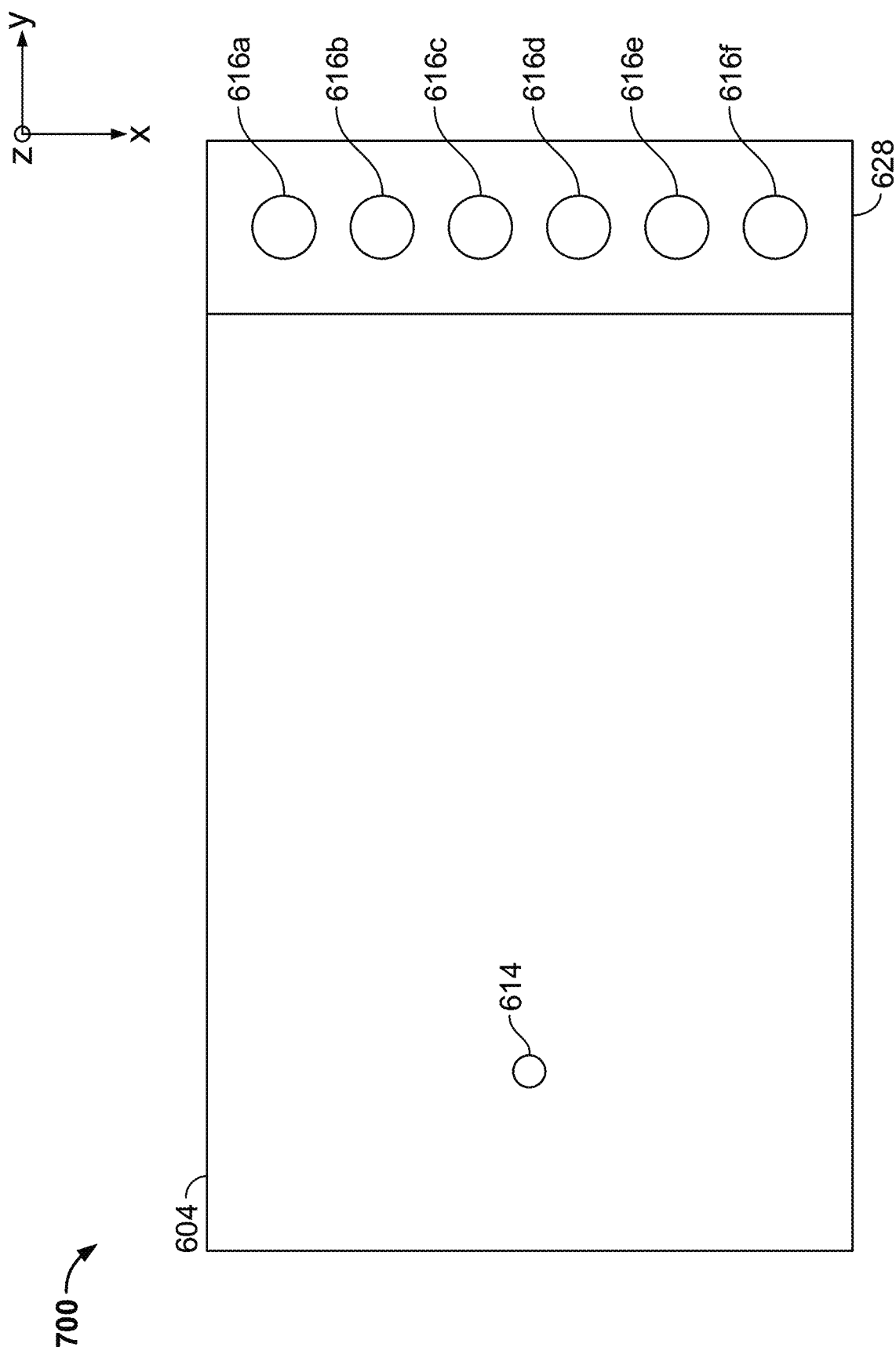
FIG. 7 shows a top view of the illustrative MEMS device of FIG. 6 including a plurality of shelf solder couplings and a single cap solder coupling, in accordance with some embodiments of the present disclosure.

FIG. 7 shows a top view of the illustrative MEMS device of FIG. 6 including a plurality of shelf solder couplings and a single cap solder coupling, in accordance with some embodiments of the present disclosure. System 700 includes cap layer 604, cap solder coupling 614, a plurality of shelf solder couplings 616a-616f, and shelf 628 of FIG. 6. In the depicted embodiment of FIG. 7, the plurality of shelf solder couplings 616a-616f are configured in a single, uniform row along the x-axis above shelf 628. It will be understood that other configurations (e.g., multiple rows of shelf solder couplings, an even distribution of shelf solder couplings, and other patterns) may be utilized (e.g., to correspond with associated components within the MEMS device). In some embodiments, system 700 may include any number of shelf solder couplings that may extend along the y-axis or x-y plane. In some embodiments, any number of cap solder couplings 614 may be configured above cap layer 604. Although particular components are depicted in certain configurations for system 700, it will be understood that components may be removed, modified, or substituted and that additional components (e.g., shelves, solder couplings, processing circuitry, etc.) may be added in certain embodiments.

Each shelf solder coupling of the plurality of shelf solder couplings 616a-616f extends beyond an isolation layer of cap layer 604 to form a soldered connection between an external component and an upper surface of the MEMS device. In addition, each of the plurality of shelf solder couplings 616a-616f couples to shelf 628, via a shelf electrical connection and electrical connection point, to either provide processed and/or raw outputs from internal components of the MEMS device to the external component for use by an end-use device (e.g., an accelerometer, a gyroscope, etc.) or to receive signals (e.g., power signals, ground signals, clock signals, control signals, data signals, etc.) from the external component to be delivered to appropriate internal components of the MEMS device. Shelf 628 includes the upper surface that extends past an edge surface of a MEMS layer of the MEMS device to form the shelf, as depicted by FIG. 7. In the exemplary embodiment of FIG. 7, the plurality of shelf solder couplings 616a-616f may be evenly distributed along the x-axis of the upper surface. In other embodiments (not depicted in FIG. 7), the plurality of shelf solder couplings 616a-616f may be distributed in other patterns for desired electrical and physical connections, for example, with a substantial percentage of the plurality of shelf solder couplings 616a-616f near corners of the MEMS device, along the exterior of the MEMS center, bunched near the center of the MEMS device, or distributed to correspond to preexisting connection points of external components of the end-use device. In this manner, the particular pattern of the plurality of shelf solder couplings 616-616f may be customized to particular applications, MEMS sensor shapes/sizes, and expected stresses incurred from other components. Although the present disclosure may generally refer to shelf solder couplings (e.g., solder balls) as forming the electrical and physical connections between electrical connection points of the MEMS device and the external components, it will be understood that other electromechanical methods of forming conductive physical connections between components may be utilized.

Figure 8:
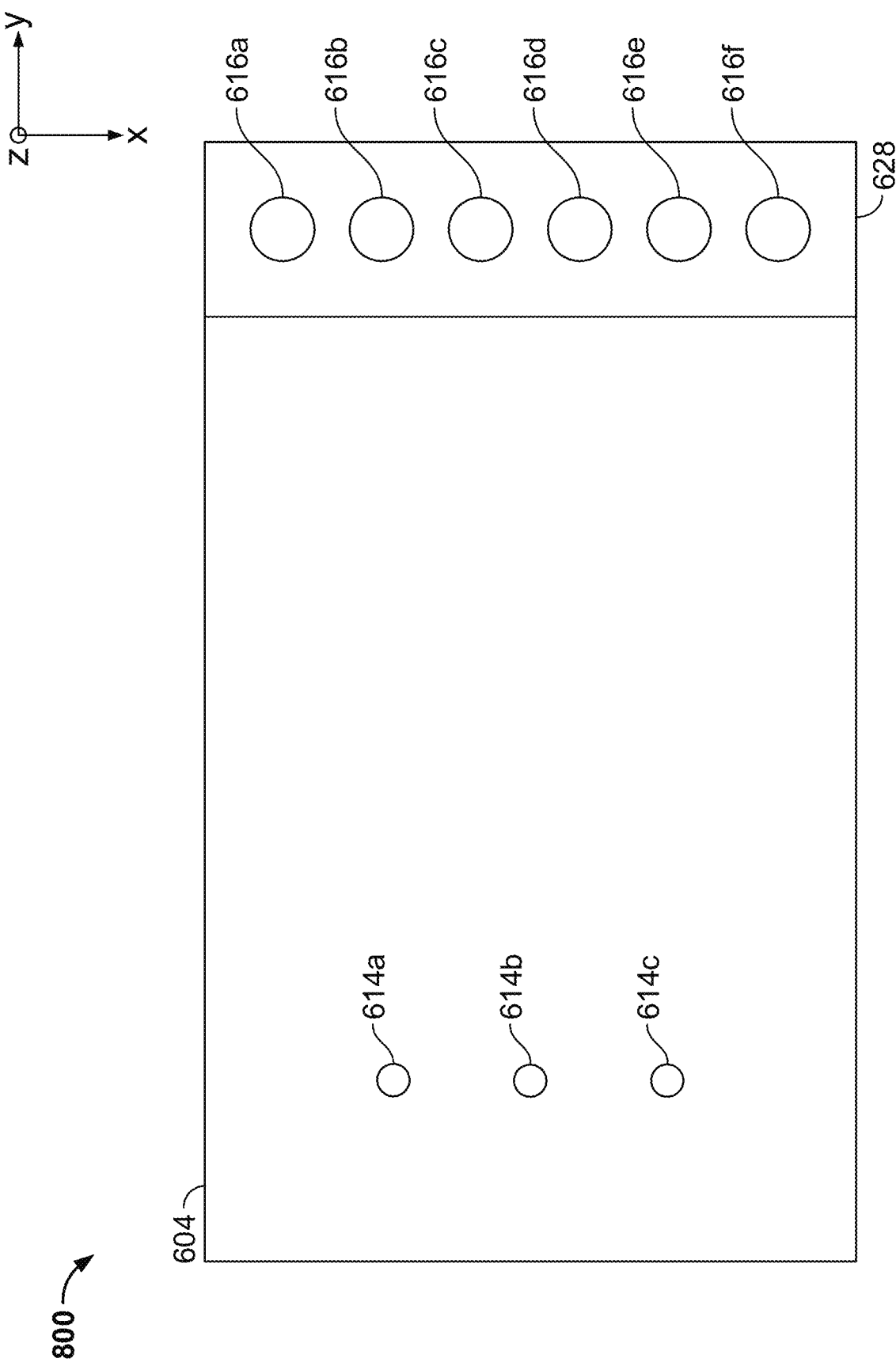
FIG. 8 shows a top view of the illustrative MEMS device of FIG. 7 including a plurality of shelf solder couplings and a plurality of cap solder couplings, in accordance with some embodiments of the present disclosure.

FIG. 8 shows a top view of the illustrative MEMS device of FIG. 7 including a plurality of shelf solder couplings and a plurality of cap solder couplings, in accordance with some embodiments of the present disclosure. System 800 includes cap layer 604, the plurality of shelf solder couplings 616a-616f, and shelf 628 of FIG. 6. In addition, system 800 includes a plurality of cap solder couplings 614a, 614b, and 614c that extend along the x-axis above cap layer 604. It will be understood that other configurations (e.g., multiple rows of cap solder couplings, an even distribution of cap solder couplings, and other patterns) may be utilized (e.g., to correspond with associated components within the MEMS device). In some embodiments, system 800 may include any number of cap solder couplings that may extend along the y-axis or x-y plane. Although particular components are depicted in certain configurations for system 800, it will be understood that components may be removed, modified, or substituted and that additional components (e.g., shelves, solder couplings, processing circuitry, etc.) may be added in certain embodiments. The plurality of cap solder couplings 614a, 614b, and 614c are configured in a single, uniform row along the x-axis above cap layer 604. Each cap solder coupling (e.g., solder ball) of the plurality of cap solder couplings 614a, 614b, and 614c forms a soldered connection between an external component and cap layer 604 and, in addition, couples to an electrical connection, via an electrical connection point, to deliver received signals (e.g., ground and/or power signals) from the external component to cap layer 604.

Figure 9:
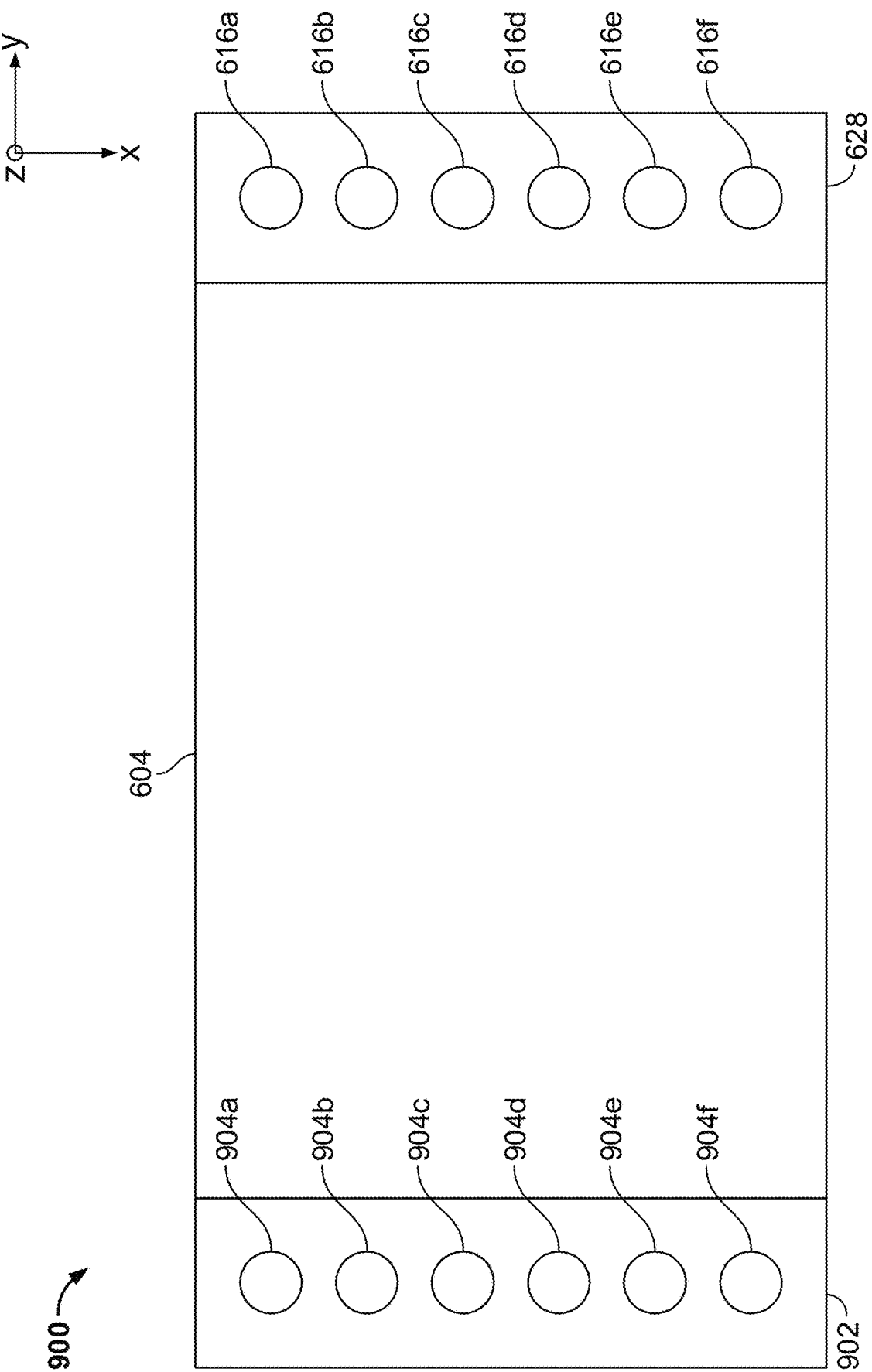
FIG. 9 shows a top view of an illustrative MEMS device with opposite, parallel shelves, each including a plurality of shelf solder couplings, in accordance with some embodiments of the present disclosure.

FIG. 9 shows a top view of an illustrative MEMS device with opposite, parallel shelves, each including a plurality of shelf solder couplings, in accordance with some embodiments of the present disclosure. System 900 includes cap layer 604, the plurality of shelf solder couplings 616a-616f, and shelf 628 of FIG. 6. In addition, system 900 includes a second plurality of shelf solder couplings 904a-904f configured in a single, uniform row along the x-axis above shelf 902. It will be understood that other configurations (e.g., multiple rows of shelf solder couplings, an even distribution of shelf solder couplings, and other patterns) may be utilized (e.g., to correspond with associated components within the MEMS device). In some embodiments, system 900 may include any number of shelf solder couplings that may extend along the y-axis or the x-y plane. Although particular components are depicted in certain configurations for system 900, it will be understood that components may be removed, modified, or substituted and that additional components (e.g., shelves, solder couplings, processing circuitry, etc.) may be added in certain embodiments.

Shelf 902 includes an upper surface of a substrate layer that extends past a second edge surface a MEMS layer to form a second shelf. As depicted by FIG. 9, shelf 902 extends along the x-axis parallel with and on opposite sides of a substrate layer from shelf 628. In some embodiments, shelf 902 may include multiple layers and/or different material at different portions of the external surface of the upper surface. In some embodiments, there may be no shelf 902 or other layer types may be included with or substituted for shelf 902. Each shelf solder coupling of the second plurality of shelf solder couplings 904a-904f (e.g., solder balls) extends beyond an isolation layer of cap layer 604 to form a soldered connection between an external component and the upper surface and, in addition, couples to shelf 902 via a plurality of connection points. It will be understood that the second plurality of shelf solder couplings 904a-904f mechanically fasten the MEMS device to the external component without any electrical connection. In some embodiments, at least one of the second plurality of shelf solder couplings 904a-904f may couple to shelf 902, via a shelf electrical connection and electrical connection point, to either provide processed and/or raw outputs from internal components of the MEMS device to an external component for use by an end-use device (e.g., an accelerometer, a gyroscope, etc.) or to receive signals (e.g., power signals, ground signals, clock signals, control signals, data signals, etc.) from the external component to be delivered to appropriate internal components of the MEMS device.

Figure 10:
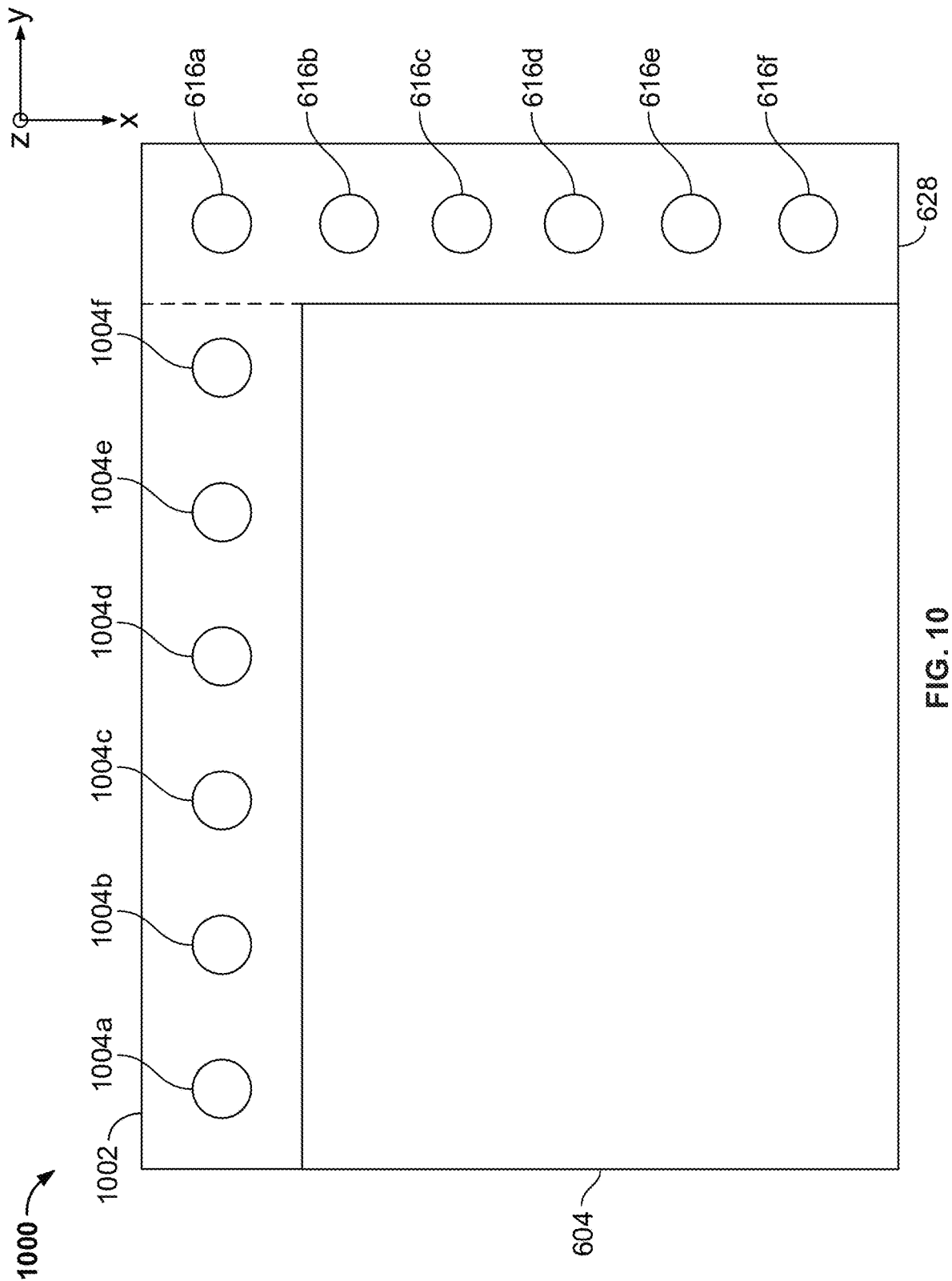
FIG. 10 shows a top view of an illustrative MEMS device with adjacent, perpendicular shelves, each including a plurality of shelf solder couplings, in accordance with some embodiments of the present disclosure.

FIG. 10 shows a top view of an illustrative MEMS device with adjacent, perpendicular shelves, each including a plurality of shelf solder couplings, in accordance with some embodiments of the present disclosure. System 1000 includes cap layer 604, shelf 628, and the plurality of shelf solder couplings 616a-616f of FIG. 6 as well as a second plurality of shelf solder couplings 1004a-1004f that extend along the y-axis above shelf 1002. It will be understood that other configurations (e.g., multiple rows of shelf solder couplings, an even distribution of shelf solder couplings, and other patterns) may be utilized (e.g., to correspond with associated components within the MEMS device). In some embodiments, system 1000 may include any number of shelf solder couplings. Although particular components are depicted in certain configurations for system 1000, it will be understood that components may be removed, modified, or substituted and that additional components (e.g., shelves, solder couplings, processing circuitry, etc.) may be added in certain embodiments.

An upper surface of a substrate layer extends past a first edge surface of a MEMS layer to form shelf 628 along the x-axis and extends past a second edge surface of the MEMS layer to form shelf 1002 along the y-axis, where shelf 628 and shelf 1002, as depicted by FIG. 10, are located on adjacent sides of the MEMS device. In some embodiments, shelf 1002 may include multiple layers and/or different material at different portions of the external surface of the upper surface. In some embodiments, there may be no shelf 1002 or other layer types may be included with or substituted for shelf 1002. A second plurality of shelf solder couplings 1004a-1004f is configured in a single, uniform row along the y-axis above shelf 1002. Each shelf solder coupling of the second plurality of shelf solder couplings 1004a-1004f extends beyond an isolation layer of cap layer 604 to form a soldered connection between an external component and the upper surface and, in addition, couples to shelf 1002, via a shelf electrical connection and electrical connection point, to either provide processed and/or raw outputs from internal components of the MEMS device to the external component for use by an end-use device (e.g., an accelerometer, a gyroscope, etc.) or to receive signals (e.g., power signals, ground signals, clock signals, control signals, data signals, etc.) from the external component to be delivered to appropriate internal components of the MEMS device. In some embodiments, the second plurality of shelf solder couplings 1004a-1004f may mechanically fasten the MEMS device to the external component without any electrical connection, while the plurality of shelf solder couplings 616a-616f may form an electrical connection between the MEMS device and the external component to bi-directionally pass signals.

Figure 11:
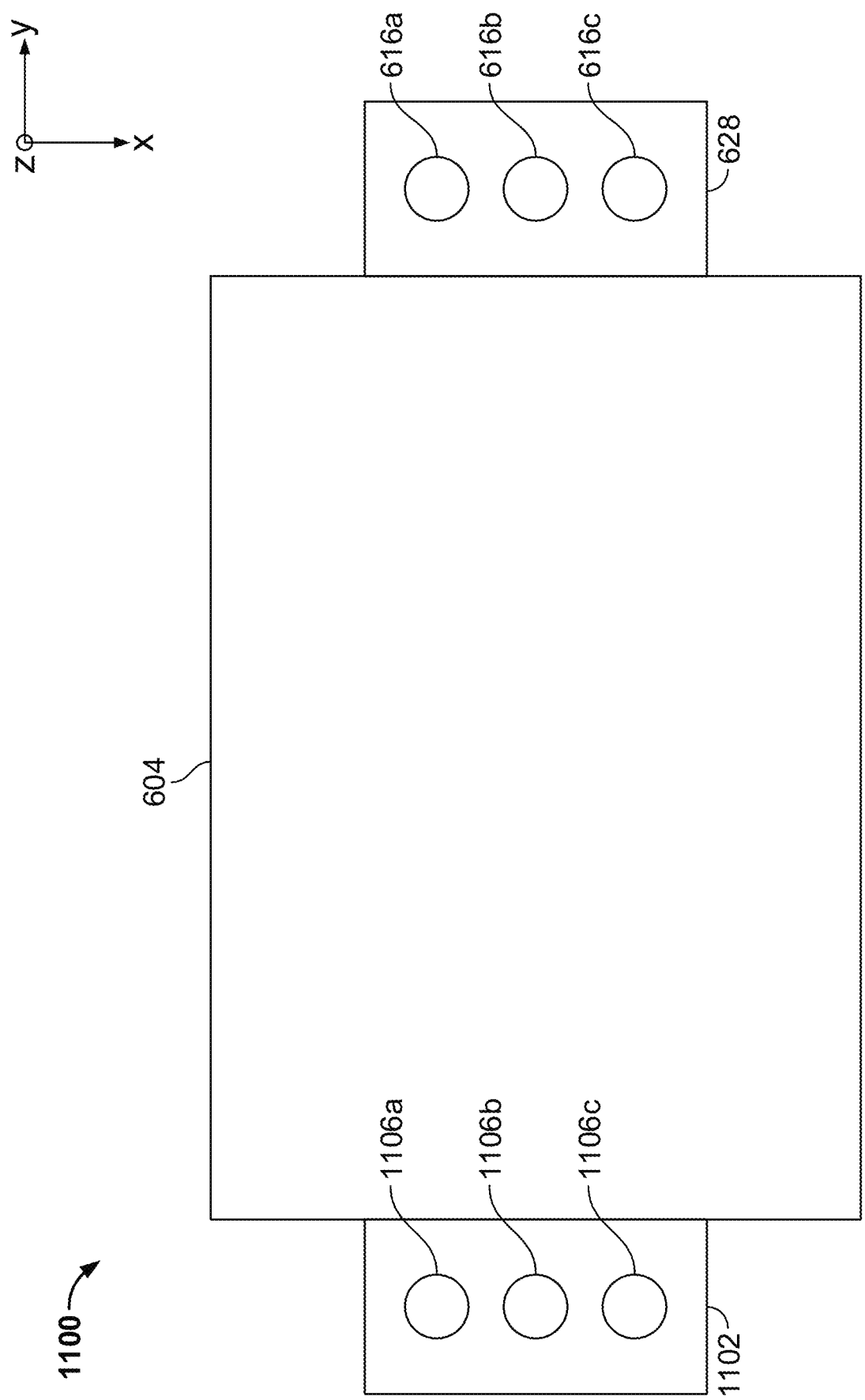
FIG. 11 shows a top view of an illustrative MEMS device with opposite, parallel, partial shelves, each including a plurality of shelf solder couplings, in accordance with some embodiments of the present disclosure.

FIG. 11 shows a top view of an illustrative MEMS device with opposite, parallel, partial shelves, each including a plurality of shelf solder couplings, in accordance with some embodiments of the present disclosure. System 1100 includes cap layer 604, shelf 628, and the plurality of shelf solder couplings 616a-616c of FIG. 6 as well as shelf 1102 and a second plurality of shelf solder couplings 1106a-1106c. The second plurality of shelf solder couplings 1106a-1106c is configured in a single, uniform row that extends along the x-axis above shelf 1102 and on opposite sides of a substrate layer from shelf 628. It will be understood that other configurations (e.g., multiple rows of shelf solder couplings, an even distribution of shelf solder couplings, and other patterns) may be utilized (e.g., to correspond with associated components within the MEMS device). In some embodiments, system 1100 may include any number of shelf solder couplings that may extend along the y-axis or the x-y plane. Although particular components are depicted in certain configurations for system 1100, it will be understood that components may be removed, modified, or substituted and that additional components (e.g., shelves, solder couplings, processing circuitry, etc.) may be added in certain embodiments.

Shelf 1102 includes an upper surface of the substrate layer that extends past an edge surface of a MEMS layer to form shelf 1102 near the MEMS device's center, as depicted by FIG. 11. Shelf 1102 extends along the x-axis parallel with and on opposite sides of the substrate layer from shelf 628. It will be understood that shelf 1102 and shelf 628 may be orthogonally configured on adjacent sides of the MEMS device. In some embodiments, shelf 1102 may include multiple layers and/or different material at different portions of the external surface of the upper surface. In some embodiments, there may be no shelf 1102 or other layer types may be included with or substituted for shelf 1102. Each shelf solder coupling of the second plurality of shelf solder couplings 1106a-1106c extends beyond an isolation layer of cap layer 604 to form a soldered connection between an external component and the upper surface and, in addition, couples to shelf 1102, via a shelf electrical connection and electrical connection point, to either provide processed and/or raw outputs from internal components of the MEMS device to an external component for use by an end-use device or to receive signals from the external component to be delivered to appropriate internal components of the MEMS device.

It will be understood that the second plurality of shelf solder couplings 1106a-1106c may mechanically fasten the MEMS device to the external component without any electrical connection. In some embodiments, at least one of the second plurality of shelf solder couplings 1106a-1106c may couple to shelf 1102, via a shelf electrical connection and an electrical connection point, to either provide processed and/or raw outputs from internal components of the MEMS device to the external component for use by the end-use device or to receive signals from the external component to be delivered to appropriate internal components of the MEMS device. In some embodiments, the plurality of shelf solder couplings 616a-616c may mechanically fasten the MEMS device to the external component without any electrical connection, while the second plurality of shelf solder couplings 1106a-1106c may form an electrical connection between the MEMS device and the external component to bi-directionally pass signals.

Although particular sizes, shapes and configurations of MEMS shelves, shelf solder couplings, and cap solder couplings have been described in the present disclosure, it will be understood that other combinations of sizes, shapes, and configurations may be utilized for different embodiments and end-use applications. For example, while external component has been depicted as a flat, planar surface located directly above the MEMS device, the external component may have a variety of different shapes and configurations that may accommodate different shelf locations, solder coupling locations, solder coupling sizes, and solder coupling types (e.g. materials, electrical connecting, etc.). Other surfaces of the MEMS device (e.g., a bottom surface of a substrate, or a perpendicular surface of any of the layers of the MEMS device) may accommodate solder couplings for connections. Although shelves have been depicted as having regular shapes and sizes based on simplicity of wafer processing, other processing may permit other shapes, e.g., to maximize physical and/or electrical connectivity with minimum shelf area. While locations of solder couplings have been depicted as having regular spacing, and solder couplings on particular surfaces (e.g., a cap or shelf) as having uniform size, shape, and material, solder coupling configurations may be irregular and/or different solder coupling types may be used on a single surface, for example, to accommodate particular configurations of electrical and/or mechanical attachment on either the MEMS device or the external component.

The foregoing description includes exemplary embodiments in accordance with the present disclosure. These examples are provided for purposes of illustration only, and not for purposes of limitation. It will be understood that the present disclosure may be implemented in forms different from those explicitly described and depicted herein and that various modifications, optimizations, and variations may be implemented by a person of ordinary skill in the present art, consistent with the following claims.

What is claimed is:

1. A microelectromechanical (MEMS) device, comprising:
   a first layer including an upper surface;
   a second layer;
   a third layer coupled between the upper surface of the first layer and the second layer and including an edge surface that extends perpendicular to the upper surface, wherein the third layer comprises one or more MEMS components, and wherein the upper surface extends beyond the edge surface to form a shelf;
   a plurality of electrical connection points located on the shelf, wherein one or more of the plurality of electrical connection points receive signals via the first layer based on a movement of the one or more MEMS components; and
   a plurality of solder couplings, wherein each of the solder couplings is bonded to one of the plurality of electrical connection points, and wherein each of the plurality of solder couplings extends from the shelf beyond an upper surface of the second layer and is configured to attach to one or more external components above the second layer.

2. The MEMS device of claim 1, wherein the one or more external components comprise a package substrate.

3. The MEMS device of claim 1, wherein the plurality of electrical connection points and the plurality of solder couplings extend along a line on the shelf, and wherein the plurality of electrical connection points is evenly distributed along the second shelf.

4. The MEMS device of claim 1, wherein the plurality of solder couplings comprises a first plurality of solder couplings, further comprising a second solder coupling located on top of the second layer and configured to attach to the one or more external components above the second layer.

5. The MEMS device of claim 4, wherein the second solder coupling forms a connection to a grounded portion of the second layer.

6. The MEMS device of claim 4, wherein the second layer includes a second upper surface, wherein a first edge of the second upper surface is located adjacent to the first plurality of solder couplings and a second edge of the second upper surface is located opposite the first plurality of solder couplings, and wherein the second solder coupling is located on a portion of the second upper surface at least one half of the distance between the first edge of the second upper surface and the second edge of the second upper surface away from the first edge of the second upper surface.

7. The MEMS device of claim 6, wherein the second solder coupling is located at least seventy-five percent of the distance between the first edge of the second upper surface and the second edge of the second upper surface away from the first edge of the second upper surface.

8. The MEMS device of claim 1, wherein the third layer comprises a second edge surface, and wherein the upper surface extends beyond the second edge surface to form a second shelf, further comprising:
 a second plurality of connection points located on the second shelf; and
 a second plurality of solder couplings, wherein each of the second plurality of solder couplings is bonded to one of the second plurality of connection points, and wherein each of the second plurality of solder couplings extends from the second shelf beyond the upper surface of the second layer and is configured to attach to the one or more external components above the second layer.

9. The MEMS device of claim 8, wherein at least one of the second plurality of connection points is a second electrical connection point, and wherein at least one of the second plurality of solder couplings is coupled to the at least one second electrical connection point.

10. The MEMS device of claim 9, wherein the second plurality of connection points extends along a line on the second shelf, and wherein the second plurality of connection points is evenly distributed along the second shelf.

11. The MEMS device of claim 10, wherein the first shelf and the second shelf extend parallel to each other on opposite sides of the first layer.

12. The MEMS device of claim 10, wherein the first shelf extends perpendicular to the second shelf on adjacent sides of the first layer.

13. The MEMS device of claim 1, wherein the plurality of solder couplings are solder balls.

14. The MEMS device of claim 13, wherein the solder balls are ovular and extend vertically from the first layer.

15. The MEMS device of claim 13, wherein the solder balls are not mechanically restrained except by the plurality of electrical connection points and by connection to the one or more external components.

16. The MEMS device of claim 13, wherein the solder balls extend beyond the upper surface of the second layer by a distance less than twenty percent of the height of the second layer and the third layer.

17. The MEMS device of claim 13, wherein the solder balls extend beyond the upper surface of the second layer by a distance less than ten percent of the combined height of the first layer, the second layer, and the third layer.

18. The MEMS device of claim 1, wherein the first layer comprises a semiconductor substrate.

19. The MEMS device of claim 1, wherein the first layer comprises a CMOS layer.

20. The MEMS device of claim 1, wherein the second layer comprises a semiconductor cap layer.

21. A microelectromechanical (MEMS) device, comprising:
 a first layer including an upper surface;
 a second layer;
 a third layer coupled between the upper surface of the first layer and the second layer and including an edge surface that extends perpendicular to the upper surface, wherein the third layer comprises one or more MEMS components, and wherein the upper surface extends beyond the edge surface to form a shelf; and
 a plurality of solder couplings, wherein each of the solder couplings is bonded to the upper surface on the shelf, and wherein each of the plurality of solder couplings extends from the shelf beyond an upper surface of the second layer and is configured to attach to one or more external components above the second layer.

22. A method for physically coupling a microelectromechanical (MEMS) device to an external component, comprising:
 providing a MEMS device comprising a first layer including an upper surface, a second layer, and a third layer coupled between the upper surface of the first layer and the second layer and including an edge surface that extends perpendicular to the upper surface, wherein the third layer comprises one or more MEMS components, and wherein the upper surface extends beyond the edge surface to form a shelf;
 providing an external component above the second layer, wherein a portion of the external component is oriented parallel to the upper surface of the shelf;
 connecting the shelf to the external component via a plurality of solder couplings, wherein each of the solder couplings is bonded to the upper surface on the shelf, and wherein each of the plurality of solder couplings extends from the shelf beyond an upper surface of the second layer and is configured to attach to the external component.

* * * * *